United States Patent
Meylan

(10) Patent No.: US 11,888,014 B2
(45) Date of Patent: Jan. 30, 2024

(54) SHORT-WAVE INFRARED DETECTOR AND ITS INTEGRATION WITH CMOS COMPATIBLE SUBSTRATES

(71) Applicant: Zedel Sàrl, Saint-Aubin-Sauges (CH)

(72) Inventor: Claude Meylan, Saint-Aubin-Sauges (CH)

(73) Assignee: ZEDEL SÀRL, Saint-Aubin-Sauges (CH)

( * ) Notice: Subject to any disclaimer, the term of this patent is extended or adjusted under 35 U.S.C. 154(b) by 484 days.

(21) Appl. No.: 16/961,527

(22) PCT Filed: Jan. 12, 2018

(86) PCT No.: PCT/EP2018/050785
§ 371 (c)(1),
(2) Date: Jul. 10, 2020

(87) PCT Pub. No.: WO2019/137620
PCT Pub. Date: Jul. 18, 2019

(65) Prior Publication Data
US 2020/0357841 A1    Nov. 12, 2020

(51) Int. Cl.
*H01L 31/0312* (2006.01)
*H01L 31/107* (2006.01)
(Continued)

(52) U.S. Cl.
CPC .. *H01L 27/14649* (2013.01); *H01L 27/14689* (2013.01); *H01L 27/14698* (2013.01);
(Continued)

(58) Field of Classification Search
CPC ......... H01L 27/14649; H01L 27/14689; H01L 27/14698; H01L 31/0312; H01L 31/107; H01L 31/1812; H01L 31/1814
See application file for complete search history.

(56) References Cited

U.S. PATENT DOCUMENTS 4,870,632 A * 9/1989 Shiono ................. G11B 7/0909
7,538,328 B1 * 5/2009 Bethke ............. H01L 27/14676
250/370.09
(Continued)

FOREIGN PATENT DOCUMENTS

WO    2006/043105 A1    4/2006

OTHER PUBLICATIONS

International Search Report, dated Sep. 26, 2018, from corresponding PCT application No. PCT/EP2018/050785.
Written Opinion, dated Sep. 26, 2018, from corresponding PCT application No. PCT/EP2018/050785.
Alharthi et al.; "Study of material and optical properties of $Si_xGe_{1-x-y}Sn_y$ alloys for Si-based optoelectronic device applications"; Optical Materials Express; Oct. 1, 2017; vol. 7, No. 10.
(Continued)

*Primary Examiner* — Herve-Louis Y Assouman
*Assistant Examiner* — Christopher M Roland
(74) *Attorney, Agent, or Firm* — NIXON & VANDERHYE, PC

(57) ABSTRACT

Disclosed is a low temperature method of fabrication of short-wave infrared (SWIR) detector arrays (FPA) including a readout wafer and absorption layer connected for improved performances. The absorber layer includes a SWIR conversion layer with a GeSn or SiGeSn alloy. A first series of process steps realizes a CMOS processed readout wafer. A buffer layer is transferred on the readout wafer and annealed at temperatures compatible with the CMOS substrate, achieving a high quality crystalline buffer layer. The method assures a temperature profile between the light entrance surface of the buffer layer, and the readout electronics so the annealing temperature remains compatible with the CMOS. The buffer layer is used for further growth of a GeSn or SiGeSn structure to create the conversion layer and achieve the final structure of the SWIR FPA. Also disclosed is a SWIR FPA detector as realized by such method, and SWIR FPA applications.

13 Claims, 6 Drawing Sheets

(51) Int. Cl.
  *H01L 27/146* (2006.01)
  *H01L 31/18* (2006.01)
(52) U.S. Cl.
  CPC ........ *H01L 31/0312* (2013.01); *H01L 31/107* (2013.01); *H01L 31/1812* (2013.01); *H01L 31/1864* (2013.01); *H01L 31/1892* (2013.01)

(56) References Cited

U.S. PATENT DOCUMENTS

| | | | |
|---|---|---|---|
| 2005/0205954 A1 | 9/2005 | King et al. | |
| 2008/0121805 A1 | 5/2008 | Tweet et al. | |
| 2008/0187768 A1* | 8/2008 | Kouvetakis | H01L 31/101 428/450 |
| 2010/0090110 A1 | 4/2010 | Tweet et al. | |
| 2012/0025212 A1* | 2/2012 | Kouvetakis | H01L 31/107 257/85 |
| 2014/0138787 A1* | 5/2014 | Hellings | H01L 31/022408 257/432 |
| 2016/0027950 A1* | 1/2016 | Liu | H01L 31/1844 438/69 |
| 2019/0172860 A1* | 6/2019 | Von Känel | H01L 27/14643 |
| 2020/0058697 A1* | 2/2020 | Meylan | H01L 27/1465 |
| 2020/0357833 A1* | 11/2020 | Meylan | H01L 27/14609 |
| 2021/0199769 A1* | 7/2021 | Meylan | G01S 7/4811 |
| 2021/0210544 A1* | 7/2021 | Fontcuberta Morral | H01L 27/14649 |

OTHER PUBLICATIONS

Aubin et al.; "Impact of thickness on the structural properties of high tin content GeSn layers", Journal of Crystal Growth; Sep. 1, 2017; pp. 20-27; vol. 473.

Lee et al.; Crystallization and Characterization of GeSn Deposited on Si with Ge Buffer Layer by Low-temperature Sputter Epitaxy:, Journal of Semiconductor Technology and Science; Dec. 2016; pp. 854-859; vol. 16, No. 6.

Mattiazzo et al.; "LePIX: First results from a novel monolithic pixel sensor"; Nuclear Instruments and Methodsin Physics Research A; Aug. 1, 2013; pp. 288-291; vol. 718.

Mosleh et al.; "Buffer-Free GeSn and SiGeSn Growth on Si Substrate Using In Situ SnD4 Gas Mixing"; Journal of Electronic Materials; Feb. 11, 2016; pp. 2051-2052; vol. 45, No. 4.

Wirths et al.; "Si—Ge—Sn alloys: from growth to applications"; Progress in Crystal Growth and Characterization of Materials; Mar. 2016; pp. 1-39; vol. 62.

Yeh et al.; "Sputter Epitaxial Growth of Flat Germanium Film with Low Threading-Dislocation Density on Silicon (001)"; ECS Journal of Solid State Science and Technology; Aug. 1, 2014; pp. Q195-Q199; vol. 3, No. 10.

Zheng et al., "GeSn p-i-n photodetectors with GeSn layer grown by magnetron sputtering epitaxy", Applied Physics Letters; Jan. 20, 2016; vol. 108, 033503.

* cited by examiner

SHORT-WAVE INFRARED DETECTOR AND ITS INTEGRATION WITH CMOS COMPATIBLE SUBSTRATES

TECHNICAL FIELD

The invention relates to the manufacturing of electromagnetic radiation detector arrays for detection and imaging comprising Complementary Metal Oxide Semiconductor (CMOS) circuits and absorption materials, both sensitive to high temperature. More precisely the invention relates to short-wave infrared (SWIR) detector arrays, and to methods for forming such structures and applications thereof.

STATE OF THE ART

Imaging detectors, equally named electromagnetic radiation photodiodes arrays or Focal Plane Arrays (FPAs), are designed to convert the optical generation of electron-hole pairs released by impacting photons into electrical signals, further processed by a readout electronics and represented as an image on a computer screen. In addition to their high spatial and temporal resolution, these detectors also offer spectral resolution, since the energy of each incident photon is proportional to the number of generated electron-hole pairs and thus measurable by pulse height analysis.

FPAs, employing direct conversion by means of semiconductor absorbers, can currently be implemented in different ways. They can first be achieved by various material deposition. Polycrystalline or amorphous materials may directly be deposited on the readout electronics made from thin film transistors, whereas single crystals—that have better transport properties—could eventually be epitaxial grown on CMOS processed readout wafers, provided specific metallization schemes will allow for high process temperatures. To the current state of knowledge, this option couldn't be realized so far.

In a second perspective, FPAs may be integrated by various bonding processes. According to the most common one, the absorber is bonded by bump-bonding that allows for the use of any suitable semiconductor material from which large crystals may be grown, such as Si, Ge or GaAs. While with this technique it is a great challenge to push the pixel size below 50 µm, bump bonding is replaced by fusion bonding, and more particularly fusion bonding along with metal-to-metal bonding of metallic pads surrounded by oxide. Both ways lead to complex structures that prevent a widespread use of the technology. By another bonding technique yet, the absorber layer and the CMOS layer are monolithically integrated by covalent bonding and subsequent annealing steps. Whereas the pixel size may be reduced by this method, according to our information, an efficient electrically conductive photodiode structure couldn't be demonstrated till now.

In an third perspective, FPAs may be achieved by different absorber materials that are either application or integration specific, depending on their sensitivity, absorption or manufacturability, among others. Si-based detectors can eventually be manufactured without the use of a bonding process as a high-resistivity absorber layer may be epitaxially grown directly on the CMOS Si substrate. The readout electronics is then CMOS processed in this epitaxial layer and the substrate subsequently removed [Mattiazzo, 2013]. While these detectors may be used for ionizing radiation in high-energy physics, detection in the short-wave infrared (SWIR) spectrum is not possible with Si-based absorbers. Wavelengths detection between 1.00 and 1.55 µm usually requires indium-gallium-arsenide (InGaAs) absorption materials, whereas recent studies have demonstrated that GeSn or SiGeSn alloys are better candidates with a higher cutoff wavelength and a better sensitivity [Wirths, 2016]. Although the GeSn growth process itself can be performed at low temperature—between 300° C. and 330° C.—its direct growth on Si is not reliable enough because of lattices mismatch and difference in the dilatation coefficients so that the integration process requires a buffer layer. Unfortunately, as known in the art [Yeh, 2014; Alharthi, 2017; Aubin, 2017; Zheng 2016], this can only be obtained at high annealing temperatures.

Thus, there is a need for a cost-effective fabrication of 3D integrated SWIR FPA allowing for layer deposition at temperatures compatible with CMOS substrates and other sensitive materials of the device, such as the conversion layer itself.

SUMMARY OF THE INVENTION

It is the aim of this invention to provide a short-wave infrared focal plane array (SWIR FPA) comprising a conversion layer based on temperature sensitive semiconductor materials—such as GeSn or SiGeSn—, a CMOS wafer, and a p-n junction in order to allow for an efficient charge collection between both layers. It is understood that this FPA has basically a p-i-n diode structure, further described as an avalanche photodiode (APD) structure including a lightly p-doped i-region. The SWIR FPA of the invention is realized by a method of fabrication comprising the deposition of a buffer layer onto the CMOS processed wafer and applying energy onto it, comprising the step of using annealing at very short light pulses duration, before providing the conversion layer on top of the buffer layer.

It is yet a further object of the invention to provide a SWIR FPA suitable for single-photon detection and, therefore, energy-resolved SWIR detection and imaging.

It is yet another object of the invention to provide a SWIR FPA which is fabricated at temperatures compatible with the CMOS substrates and other sensitive materials of the device, such as the conversion layer itself.

More precisely, the invention is achieved by a method of fabrication of a SWIR FPA comprising a readout wafer comprising a CMOS readout layer, having a deposition surface and a p-n junction, said SWIR FPA comprising a buffer layer, and a SWIR light absorbing layer, comprising at least germanium (Ge) and tin (Sn), on said buffer layer, The method of the invention consists essentially of the following steps (A-D):
  A. fabricating a readout wafer having a deposition surface, comprising a CMOS readout layer, said readout wafer comprising a p-n junction;
  B. providing on said deposition surface a buffer layer comprising at least partially Ge, said buffer layer comprising an oxide-free buffer layer surface;
  C. sending light pulses, provided by a light source situated to the side of said buffer layer opposite to said readout wafer, so as to anneal said buffer layer by the heat provided by the absorption of said light pulses and so that temperature of the CMOS readout layer remains lower than 350° C. during the annealing process;
  D. depositing on said buffer layer, at temperatures lower than 350° C., an absorption layer comprising at least germanium (Ge) and tin (Sn).

In an embodiment said buffer layer made at least partially of Ge.

In an embodiment said buffer layer is made of $Ge_{1-x}Sn_x$ and has a Sn content x between $0.00 \leq x \leq 0.03$.

In an embodiment said buffer layer is realized by sputter epitaxy.

Advantageously said buffer layer is grown by reduced-pressure chemical-vapor deposition (RP-CVD).

In an embodiment said absorbing layer is made of $Ge_{1-x}Sn_x$.

In an embodiment said absorbing layer has a Sn content x which is higher than 0.03 and lower than 0.12.

In an embodiment wherein said absorbing layer is made of $Si_xGe_{1-x-z}Sn_z$.

In an embodiment the Si content x is higher than 0.06 and lower than 0.20.

In an embodiment the Sn content z is higher than 0.02 and lower than 0.10.

In an embodiment said absorbing layer comprises at least one layer made of $Ge_{1-x}Sn_x$ and a second layer made of $Si_xGe_{1-x-z}Sn_z$.

In an embodiment the annealing temperature of the first layer during the annealing process step C remains lower than 750° C.

In an embodiment the annealing temperature of the first layer during the annealing process step C is higher than 650° C.

In an embodiment the light source provides light having a wavelength that is comprised between 230 nm and 900 nm.

In an embodiment the light is provided by a pulsed light source providing light pulses having a pulse duration of said light pulses is lower than 1 ms and preferably lower than 100 ns.

In an embodiment wherein the light source comprises at least one laser.

In an embodiment said light source comprises at least two lasers and wherein said light is provided by the combined light beams of said at least two lasers.

In an embodiment said two lasers are comprised in an excimer laser.

In another embodiment said two lasers are provided by laser spike annealing (LSA).

In an embodiment the light source comprises at least one flash lamp.

In an embodiment step C is performed by immersing said readout wafer comprising said first layer under a liquid and performing said light radiation while said readout wafer is immersed in said liquid.

In an embodiment said liquid is water.

In an embodiment the method comprises a process step wherein the readout wafer and/or the first layer and/or the absorption layer undergo ion or electron beam irradiation so that the annealing temperature of said first layer is reduced by at least 100° C.

In an embodiment the fabrication of said CMOS processed readout wafer comprises the steps of:

a1) providing a SOI type wafer being a low doped p or n type SOI wafer comprising a CMOS readout layer comprising readout electronics and a handle wafer;

a2) forming the readout wafer with a field oxide by implanting of p-MOS transistors and n-MOS transistors, along with implants for charge collection, the doping sign and conduction type of which is the same as that of the bulk low doped Si layer, the CMOS processed Si layer also comprising contact pads for connecting the readout electronics;

a3) deposit an oxide layer on said CMOS readout layer so as to provide a plane oxide layer surface;

a4) realize a readout carrier layer on top of said plane oxide layer surface by a plasma activation process for low temperature oxide-to-oxide fusion bonding;

a5) thinning said readout carrier layer so as to provide an epitaxial layer by a combination of grinding and plasma etching;

a6) providing a smooth, clean and oxide-free deposition surface by chemical mechanical polishing and passivating.

In an embodiment the method comprises the following additional steps:

c1) deposit a $Ge_{1-x}Sn_x$ or a $Si_xGe_{1-x-z}Sn_z$ absorber layer on said oxide-free buffer surface;

c2) deposit a Ge contact layer on said absorber layer;

c3) removing said readout carrier layer;

c4) realize a secondary carrier on said Ge contact layer;

c5) realizing opening contacts through said oxide layer;

c6) forming electrical contacts to said readout layer;

c7) removing said secondary carrier;

c8) realizing on said readout layer a detector carrier layer.

In an embodiment the method comprises the additional step of providing an optical layer on said Ge contact layer.

The invention is also achieved by a SWIR detector array realized by the described method of fabrication, comprising at least one SWIR light conversion layer having an incident light surface and a doped readout wafer, being either p-doped or n-doped, comprising:

a p-n junction;

an array of charge collecting areas being either p-doped or n-doped charge collecting areas;

an electrical circuit situated in said readout wafer and comprising a detector array configured to detect electromagnetic waves having a wavelength comprised between 1.0 μm and 3.0 μm.

In an embodiment the p-n junction is situated at the interface of the buffer layer and the CMOS readout wafer.

In an embodiment said p-n junction is situated to the side of said buffer layer.

In an embodiment said p-n junction is situated to the side of said readout layer.

In an embodiment said readout electrical circuit is a CMOS type circuit processed in said readout layer so as to be electrically accessible in said detector lower surface.

In an embodiment said light conversion layer has a thickness t1, defined in a direction perpendicular to said support layer of more than 350 nm, preferably more than 1 μm, still preferably more than 3 μm.

In variants the optical layer comprises an array of refractive microlens, or an array of diffractive microlenses, or an array of aspheric shaped microlenses, or an array of microprisms or an array of plasmonic planar metalenses allowing for multi/hyper-spectral imaging and analysis.

BRIEF DESCRIPTION OF THE DRAWINGS

Further details of the invention will appear more clearly upon reading the following description in reference to the appended figures.

DETAILED DESCRIPTION AND EMBODIMENTS OF THE INVENTION

Figure 1:
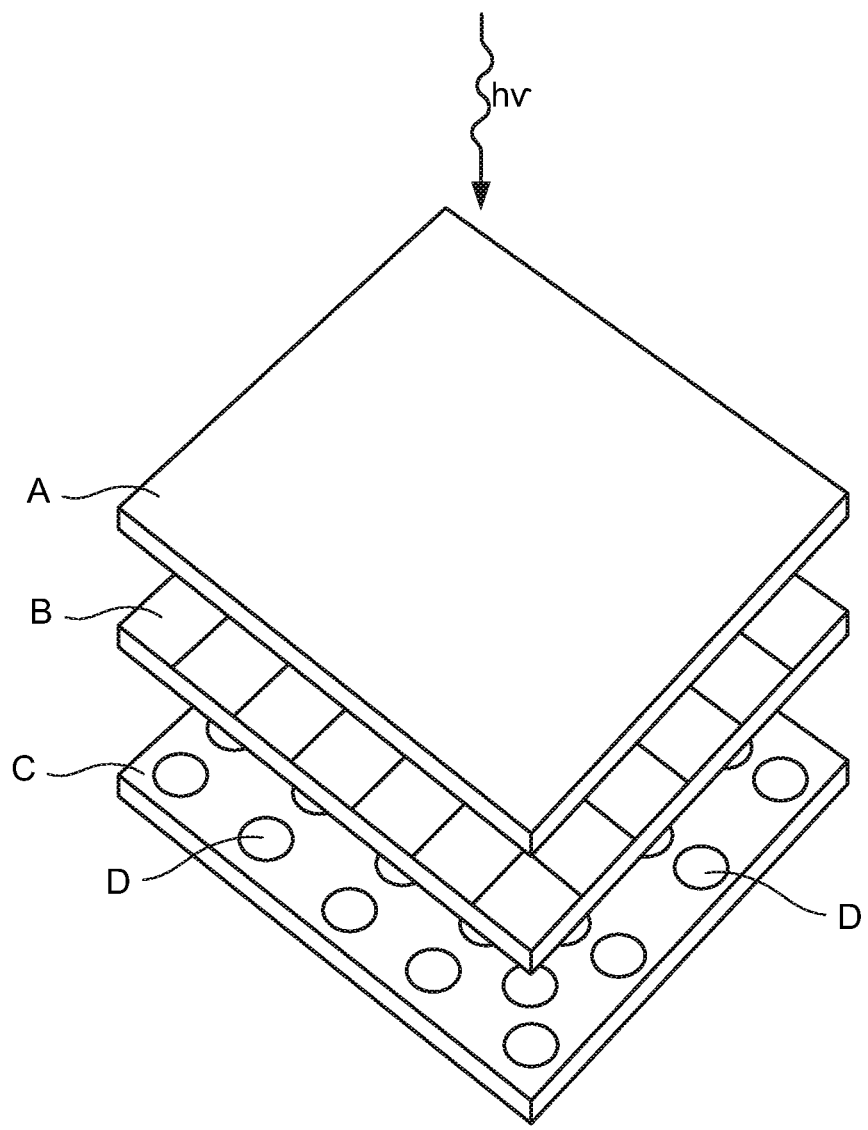
FIG. 1 illustrates a cross-section of an hybrid detector array of prior art having an absorber layer and a readout layer connected by bump-bonding.

FIG. 1 illustrates a SWIR detector array 1 of prior art. As described in the prior art such a detector array comprises typically a microlens array (A) and an absorber sheet typically made of InGaAs (B), as well as a readout circuit realized on a separate layer or wafer. The stack comprising the optical layer (A) and the absorber layer (B) is electrically and mechanically connected to the CMOS layer (C) by an array of bumps (D).

The hybrid assembly of prior art infrared detector arrays, as illustrated in FIG. 1, requires a complex and delicate alignment process and does not allow to provide large, cheap, reliable and high efficient SWIR detector arrays. It is the aim of this invention to provide simple structures and methods for the fabrication of sensitive SWIR FPA's.

Compared to infrared detectors of prior art, the device of the invention provides a highly efficient monolithic SWIR detector array 1 comprising a simplified 3D integrated structure having a small thickness, a reduced weight and lower power requirements. The SWIR detector array 1 of the invention is also called a focal plane array (FPA) hereafter. The device of the invention allows to provide very sensitive and large area monolithic FPAs able to cover efficiently the whole SWIR spectrum at room-temperature or eventually Peltier-cooled operation. Said SWIR spectrum is defined by a wavelengths range between 1.0 µm and 3.0 µm.

The SWIR detector array 1 of the invention comprises at least one buffer layer 60, a SWIR light conversion layer 80, also defined as absorber layer, and a readout wafer 21 being either p-doped or n-doped configured to detect electromagnetic waves having a wavelength comprised between 1.0 µm and 3.0 µm.

Figure 2:
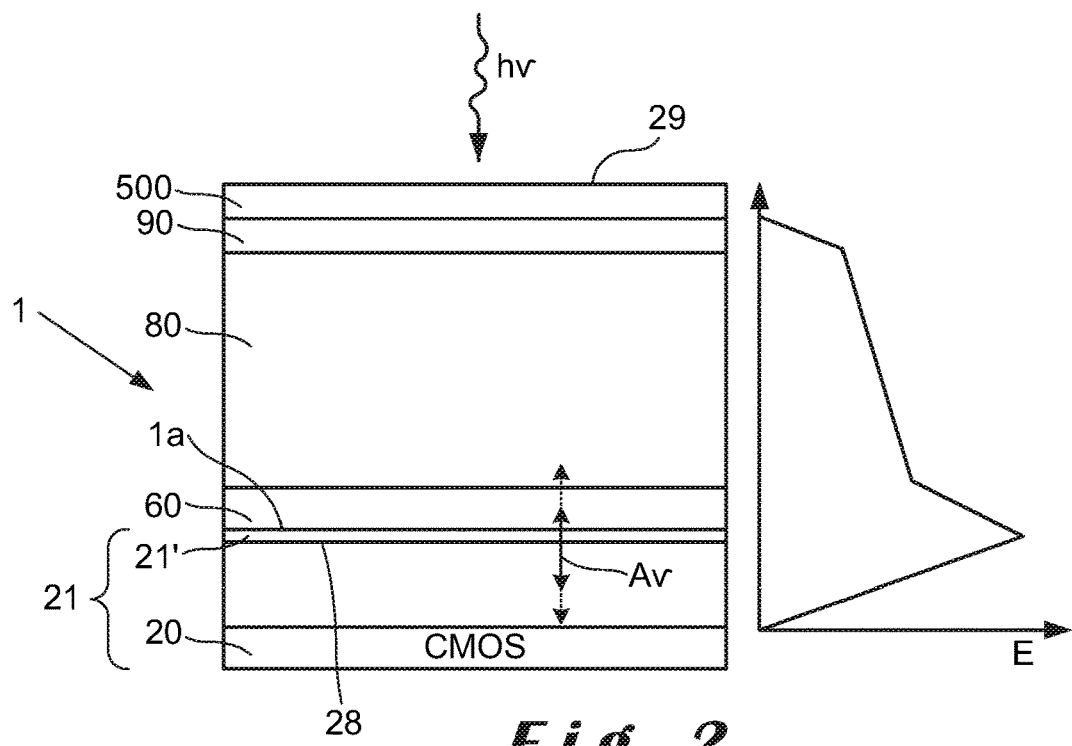
FIG. 2 illustrates a preferred embodiment of the invention comprising a p-i-n diode structure with an avalanche region and the electric field across the detector.

FIG. 2 illustrates an embodiment of the SWIR detector array 1 of the invention, comprising a p-i-n diode structure, and an avalanche region (AV). The scope of the avalanche region (AV) depends on the particular configuration of the SWIR detector 1 and is therefore shown as an arrow. The readout electronics is preferably processed in an epitaxial Si layer with a thickness of about 10-30 µm and a resistivity above about 500 Ωcm or preferably about 1-2 kΩcm or more preferably 2-5 kΩcm or even above 5 kΩcm, for example 5-50 kΩcm, the resistivity being due to a low doping level in between about $10^{11}$ to $10^{13}$ $cm^{-3}$ of a first conduction type (for example n-conduction induced by n-doping). For ease of detector manufacturing, silicon-on-insulator (SOI) wafers may be used for the CMOS processing of the readout electronics. The thickness and the material used for the absorption layer strongly depends on the energy of the electromagnetic radiation to be detected. A cross section of an embodiment of the of the SWIR detector array 1 is illustrated in FIG. 2. As illustrated in a cross section in FIG. 3, the silicon layer 20 comprises n+ charge collectors 24, whereas the contact layer 90 is a highly p-doped layer. In the embodiment of FIG. 2 said absorption layer 80 is non-doped. In a variant of said preferred embodiment said absorption layer 80 may be a lightly p-doped layer. Each photon incident on the absorption layer 80 creates an electron-hole pair in the absorber 80. The hole is collected at the incident light side and the electron, created by the absorption of a photon, drifts to the avalanche region AV situated to the side of the p-n junction and is accelerated to sufficient energy to initiate a chain of impact ionization events, creating offspring electron-hole pairs and leading to internal gain. In the Geiger mode, known to the person skilled in the art, in which single photon can initiate an avalanche that is self-sustaining, carrier generation predominates over extraction leading to exponential growth of the current. In this mode the detector array has to be electrically reset by reducing the bias to below breakdown long enough to terminate the avalanche, a process known as quenching. Thus, when a reverse bias is applied to the back contact 29, the space charge layer expands from the p-n junction 28, illustrated in FIG. 3, both into the n-doped region of Si wafer 21 and into lightly p-doped layer 21' as well as p-conducting absorption layer 80. FIG. 2 illustrates also the electric field E across the detector when a reverse bias is applied to the back contact 29. In variants said p-n junction 28 may be formed to the side of the slightly p-doped layer 21' opposite to said silicon layer 20.

By construction, the SWIR FPA 1 of the invention provides single-photon detection. It is therefore suitable for energy discrimination, whereby the energy of photons incident on the absorber can be measured by employing the pulse height analysis of the electrical pulses processed by the readout electronics.

The avalanche photodiode structure of the detector array 1 comprises a buffer layer 60, as illustrated in FIG. 2, 4 and may comprise further layers such as charge layers. In an embodiment said buffer layer 60 made at least partially of Ge. In an embodiment said buffer layer 60 is made of $Ge_{1-x}Sn_x$ and has a Sn content x between 0.00≤x≤0.03. Said buffer layer 60 may be advantageously be realized by sputter epitaxy.

In an embodiment, said buffer layer is advantageously achieved by reduced-pressure chemical-vapor deposition (RP-CVD).

In an embodiment said absorbing layer 80 is made of $Ge_{1-x}Sn_x$.

Advantageously said absorbing layer 80 has a Sn content x which is higher than 0.03 and lower than 0.12.

In an embodiment wherein said absorbing layer 80 is made of $Si_xGe_{1-x-z}Sn_z$. Advantageously the Si content x is higher than 0.06 and lower than 0.20. Advantageously the Sn content z is higher than 0.02 and lower than 0.10.

In an embodiment said absorbing layer 80 comprises at least one layer made of $Ge_{1-x}Sn_x$ and a second layer made of $Si_xGe_{1-x-z}Sn_z$.

Depending on the desired electrical performances of the detector array 1 the layers of the detector 1 may be configured so as to shape a predetermined electrical field profile across the avalanche structure of the detector 1. Shaping electrical field profiles is well known in the art and is not further commented here.

Figure 3:
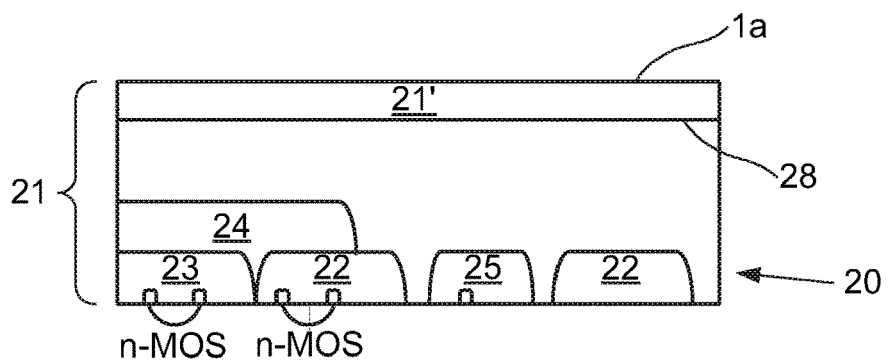
FIG. 3 illustrates a cross-section of the CMOS processed readout wafer of a SWIR FPA with a p-n junction.
Figure 4:
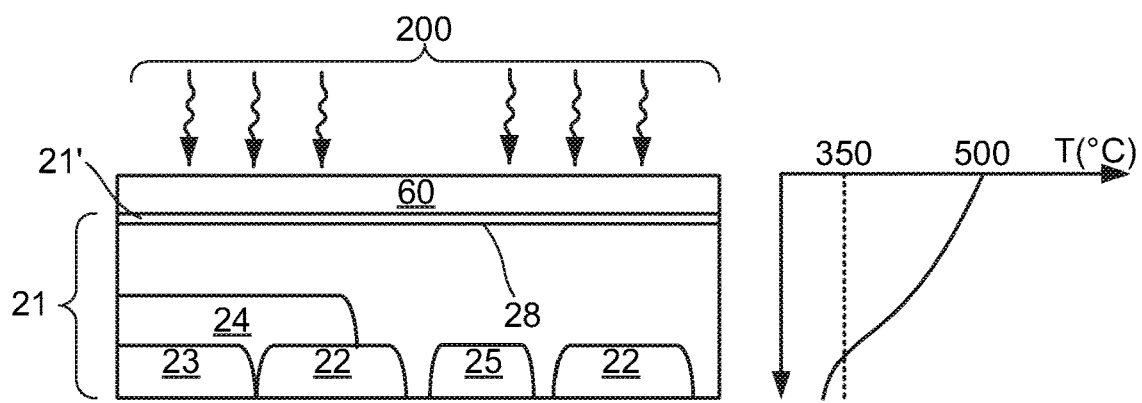
FIG. 4 illustrates the temperature profile, during the buffer annealing process step, across a cross-section of the CMOS processed readout wafer with, on top of it, a deposited buffer layer.

FIG. 3 illustrates an exemplary execution of a small part of the cross-section of the thinned CMOS processed readout wafer 21 of a SWIR FPA 1 comprises a p-n junction 28, the CMOS processed readout wafer 21 comprising a lightly p-doped layer 21'. The width of the section illustrated in FIG. 3, defined in the plane of the readout wafer 21, corresponds to slightly more than a single pixel size of the detector array 1, and may range for example from 5-20 µm, 20-50 µm, 50-100 µm, depending on the CMOS process used. In this configuration n-wells 25 serve as charge collectors, collecting electrons coming from electron-hole pairs which are generated by incident photons and separated in the electric field of the p-n junction formed by lightly n-doped Si CMOS processes readout wafer 21 and lightly p-doped layer 21'. The distance between adjacent n-wells 25 defines the pixel size of the detector array. In the embodiment of FIGS. 3 and 4, the n-MOS and p-MOS transistors of the pixel electronics of the readout are situated in p-wells 22 and n-wells 23, respectively. A deep p-well 24 arranged on said p-wells 22 and n-wells 23, has the purpose of avoiding electron collection by n-wells 23 in addition to charge collecting by n-well 25. In an aspect of the embodiment part of the pixel electronics may be located in n-well 25. In this configuration the p-n junction 28 is inside the readout wafer at the interface between said lightly p-doped layer 21' and the lightly n-doped main part of SOI wafer 21. The lightly n-doped main part of SOI wafer 21 comprises a thin, lightly p-doped Si layer with a highly resistive n-doped layer on top, hosting the CMOS processed readout. The lightly p-doped layer 21' may have a thickness of about 1-2 µm, 2-5 µm or even in the range from 5-50 µm or 50-100 µm. Substrate and buried oxide of the SOI wafer are thereby removed prior to further processing of the device.

The invention is also achieved by a method of fabrication of the short-wave infrared detector array as described above. The infrared detector comprises a readout layer 21 having a deposition surface 1a and comprising a CMOS readout layer 20, and a p-n junction 28, said short-wave infrared detector array 1 comprising a buffer layer 60 situated on said deposition surface 1a and a short-wave infrared light absorbing layer 80 comprising at least germanium (Ge) and tin (Sn), situated on said buffer layer 60, More precisely the method comprising the steps (A-D) of:
A. fabricating a readout layer 21 having a deposition surface 1a, comprising a CMOS readout layer 20 and comprising a p-n junction 28;
B. providing on said deposition surface 1a a buffer layer 60 comprising at least partially Ge, said buffer layer 60 comprising an oxide free buffer surface 60a;
C. sending light pulses 200, provided by a light source situated to the side of said buffer layer 60 opposite to said readout layer 21, so as to anneal said buffer layer 60 by the heat provided by the absorption of said light pulses 200 and so that temperature of the CMOS readout layer 20 remains lower than 350° C. during the annealing process, as illustrated in FIG. 4; said pulses are provided preferably by the combination of light beams from multiple oscillators resulting in fewer high-energy light pulses generating less heat diffusion;
D. depositing on said buffer layer 60, at temperatures lower than 350° C., an absorption layer 80 comprising at least germanium (Ge) and tin (Sn).

The deposition of a buffer layer 60 between the Si CMOS processed readout wafer and the absorption layer is an essential step to overcome the differences of lattices and dilatation coefficients between Si and materials such as GeSn or SiGeSn.

The deposition process may be achieved by different ways that determine the performance of the detector as well as the industrial scalability of its manufacturing [Mosleh, 2015; Zheng, 2016; Dong, 2017]. In a variant, the buffer layer 60 is deposited by magnetron sputtering. In another embodiment, the buffer layer 60 is grown by reduced-pressure chemical-vapor deposition (RP-CVD). In an embodiment said first layer is a buffer layer made at least partially of Ge.

In an embodiment said buffer layer 60 is made of $Ge_{1-x}Sn_x$ and having a Sn content x between $0.00 \leq x \leq 0.03$.

In an embodiment the annealing temperature of the buffer layer 60 during the annealing process remains lower than 750° C.

In an embodiment the annealing temperature of the buffer layer 60 during the annealing process is higher than 650° C.

In an embodiment the light source 200 provides light having a wavelength that is comprised between 230 nm and 900 nm.

In an embodiment the light is provided by a pulsed light source providing light pulses having a pulse duration of said light pulses 200 is lower than 1 ms and preferably lower than 100 ns.

In an embodiment the light source comprises at least one laser.

In an embodiment said light source 200 comprises at least two lasers and wherein said light is provided by the combined light beams of said at least two lasers.

In an embodiment said two lasers are comprised in a single excimer laser in which light pulses are provided preferably by the combination of ultraviolet light beams resulting from multiple optical oscillators of said two lasers, resulting in fewer high-energy light pulses generating less heat diffusion that may harm the CMOS structure.

In another embodiment said two lasers are provided by laser spike annealing (LSA) that provide light pulses provided preferably by the combination of infrared light beams from multiple oscillators.

In an embodiment the light source comprises at least one flash lamp.

In an embodiment step C is performed by immersing said readout wafer comprising said first layer 21 under a liquid and performing said light radiation while said readout wafer 21 is immersed in said liquid.

In an embodiment said liquid is water.

In an embodiment the method comprises a process step wherein the readout wafer and/or the first layer and/or the absorption layer undergo ion or electron beam irradiation so that the annealing temperature of said first layer is reduced by at least 100° C.

Figure 5A:
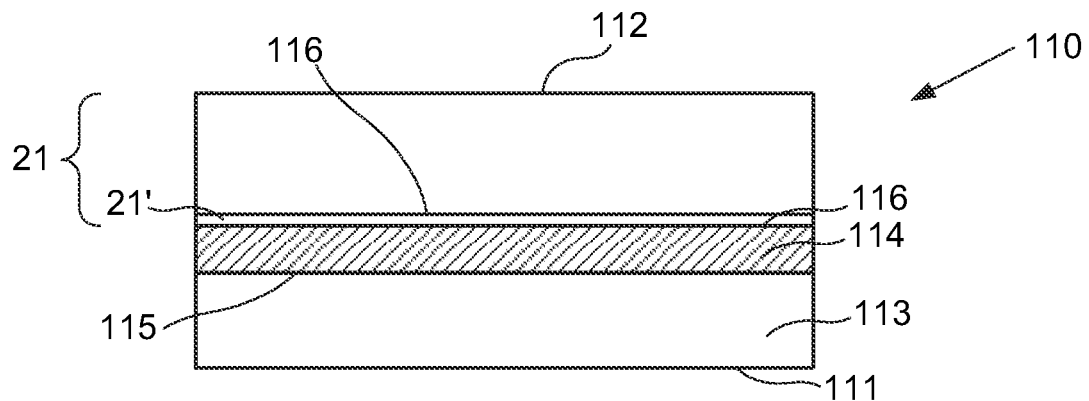
FIGS. 5-6 illustrate cross sections of process steps of the method of fabrication of a thinned CMOS processed readout wafer.
Figure 5B:
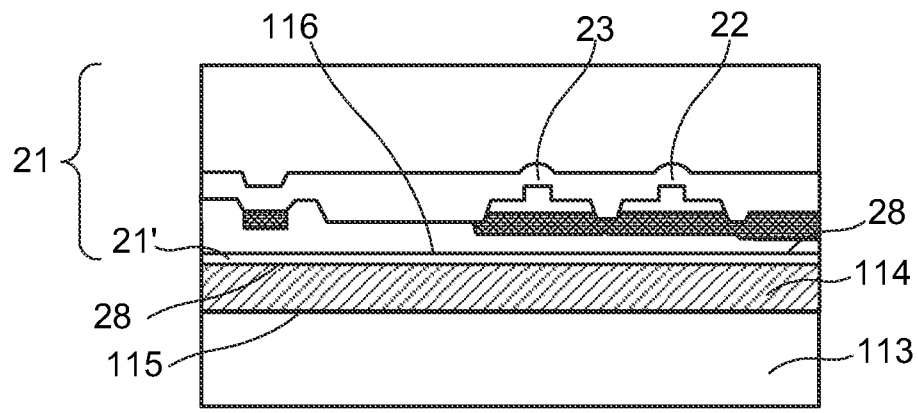
Figure 5C:
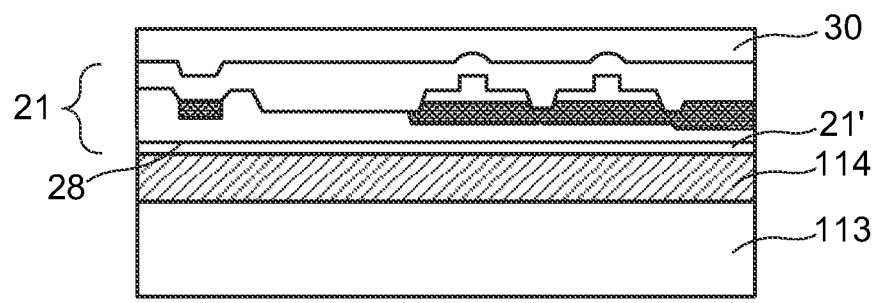
Figure 6A:
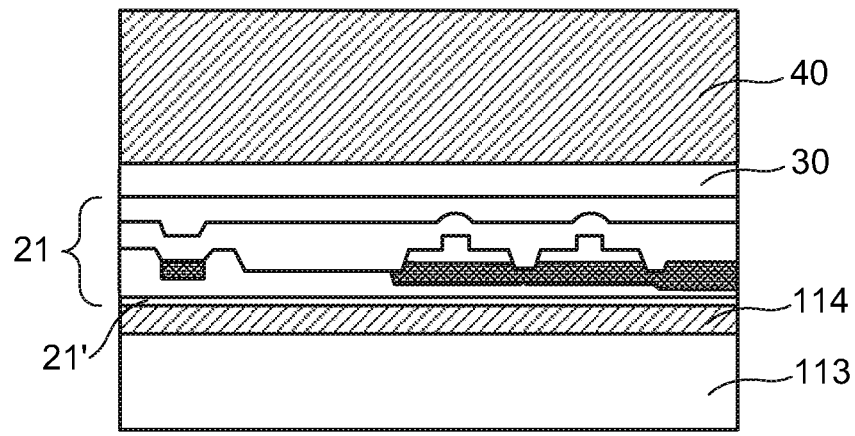
Figure 6B:
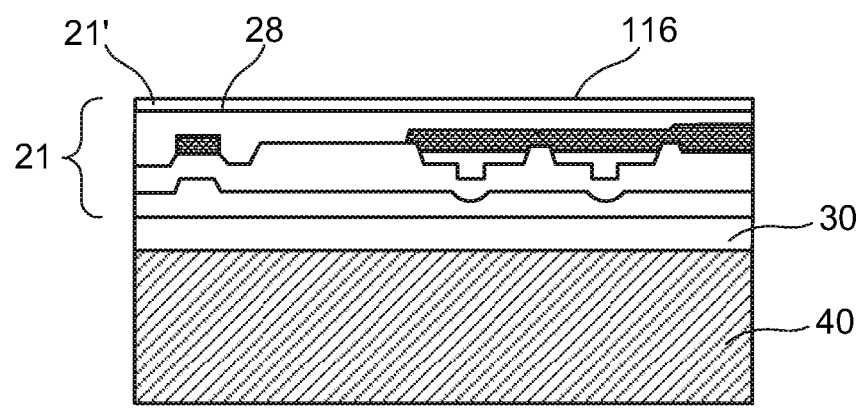

Referring to FIGS. 5-6 the fabrication of the thinned CMOS processed readout wafer comprises the following steps:

a1) providing a wafer 110 having a lower surface 111 and an upper surface 112; wafer 110 may be an SOI wafer comprising a substrate 113, an oxide layer 114 having a lower interface 115 and upper interface 116, and Si layer 21 as illustrated in FIG. 5.a. The Si layer 21 is preferably an epitaxial layer and may be either n-conducting or p-conducting (electron conduction or hole conduction), depending on whether the low doping is of n-type or p-type; the thickness of the Si layer 21 is preferably smaller than 30 µm and even more preferably smaller than 10-20 µm; its resistivity should be above about 500 Ωcm, preferably at least 1-2 kΩkm or more preferably 2-5 kΩkm or even above 5 kΩkm, for example 5-50 kΩkm; in a preferred embodiment, the Si layer 21 has a thin layer 21' of opposite doping type close to interface 116 with oxide layer 114, so as to realize a p-n junction as illustrated in FIG. 5.b;

a2) processing the CMOS readout wafer 21, by implanting of p-MOS transistors 23 and n-MOS transistors 22, along with implants 25 for charge collection, the doping sign and conduction type of which is the same as that of the bulk of Si layer 21. The spacing of adjacent implants 25 defines the pixel size of the detector array 1. CMOS processed Si layer 21 also contains other circuit elements, as well as contact pads for connecting the readout electronics to the outside world as illustrated in FIG. 5.*b*;

a3) depositing an oxide layer 30 on said CMOS readout layer 21 so as to provide a plane oxide layer surface by chemical-mechanical processing 32 as illustrated in FIG. 5.*c*;

a4) realizing a readout carrier layer 40 on top of said plane oxide layer surface 30 by a plasma activation process known in the art for low temperature oxide-to-oxide fusion bonding as illustrated in FIG. 6.*a*;

a5) thinning said CMOS readout wafer 113, as illustrated in FIG. 6.*b*, by a combination of grinding and plasma etching as known in the art;

a6) providing a smooth, clean and oxide-free deposition surface 116 by chemical mechanical polishing and passivating; the thickness of Si layer 21 may thereby be slightly reduced, but should be sufficiently small in order not to remove a thin optional layer 21' doped oppositely to the main body of layer 21.

Figure 7A:
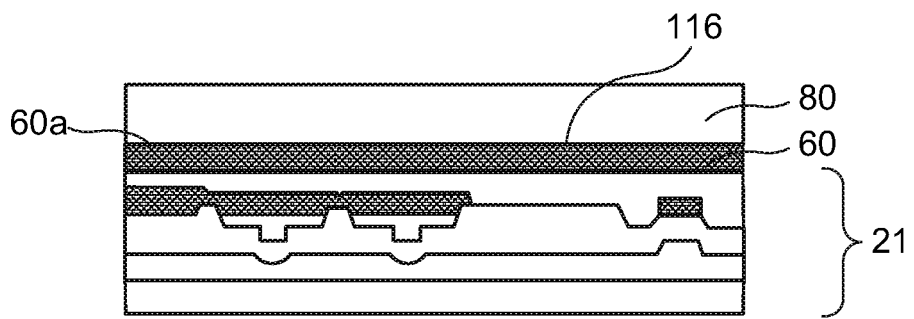
FIG. 7 illustrates process steps to achieve the deposition of a buffer layer and an absorption layer and an additional sequence of steps for the fabrication of the SWIR FPA of the invention.
Figure 7B:
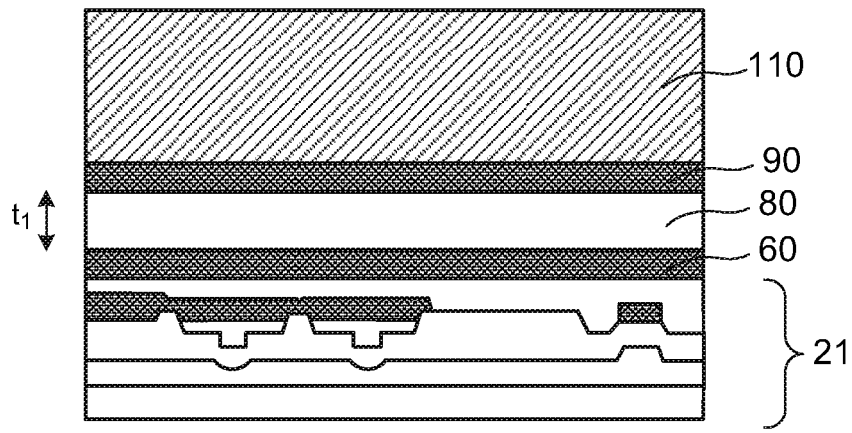
Figure 7C:
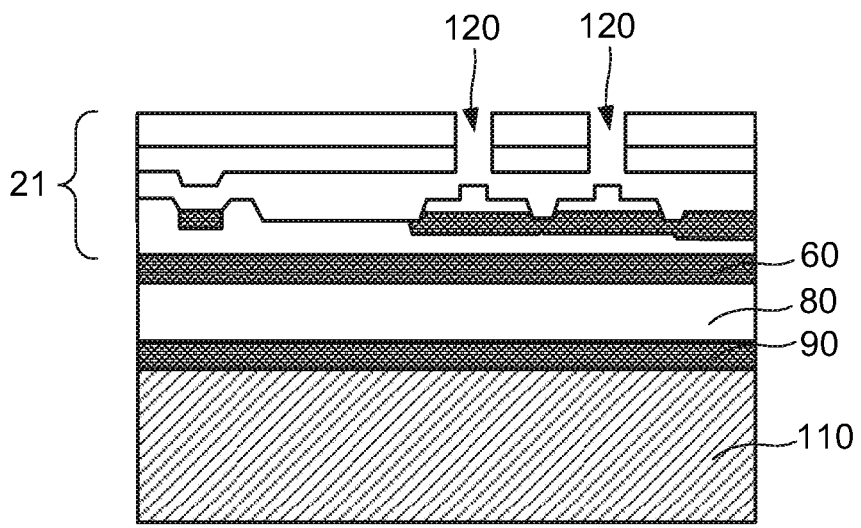

Referring now to FIGS. 7*a*-*c* the method comprises the following additional steps:

c1) deposit, as illustrated in FIG. 7.*a*, on said buffer layer 60, a $Ge_{1-x}Sn_x$ or a $Si_xGe_{1-x-z}Sn_z$ absorber layer 80 on said oxide-free buffer surface 60*a*; in an embodiment, this deposition process will be performed by reduced-pressure chemical-vapor deposition (RP-CVD) or magnetron sputtering that can offer viable industrial scalability;

c3) deposit a highly p-doped Ge contact layer 90 on said absorber layer 80;

c4) removing said readout carrier layer 40;

c4) realizing a secondary carrier 110 on said Ge contact layer 90, as illustrated in FIG. 7.*b*;

c5) realizing opening contacts 120 through said oxide layer, illustrated in FIG. 7.*c*;

c6) forming electrical contacts to said readout layer;

c7) removing said secondary carrier 110;

c8) realizing on said readout layer 21 a detector carrier layer, not show in the figures.

The method may comprise an additional step of providing an optical layer 500 on said Ge contact layer 90.

In an embodiment said p-n junction 28 is situated at the interface of the buffer layer 60 and the CMOS readout wafer 21.

In an embodiment said p-n junction is situated to the side of said buffer layer 60.

In an embodiment said p-n junction is situated to the side of said readout layer 21.

In an embodiment said readout electrical circuit 20 is a CMOS type circuit processed in said readout layer so as to be accessible in said detector lower surface.

In an embodiment said light conversion layer 80 has a thickness t1, defined in a direction perpendicular to said support layer of more than 350 nm, preferably more than 1 µm, still preferably more than 3 µm.

In variants the optical layer 500 comprises an array of refractive microlens, or an array of diffractive microlenses, or an array of aspheric shaped microlenses, or an array of microprisms or an array of plasmonic planar metalenses allowing for multi/hyper-spectral imaging and analysis.

Simulation Results

Figure 8:
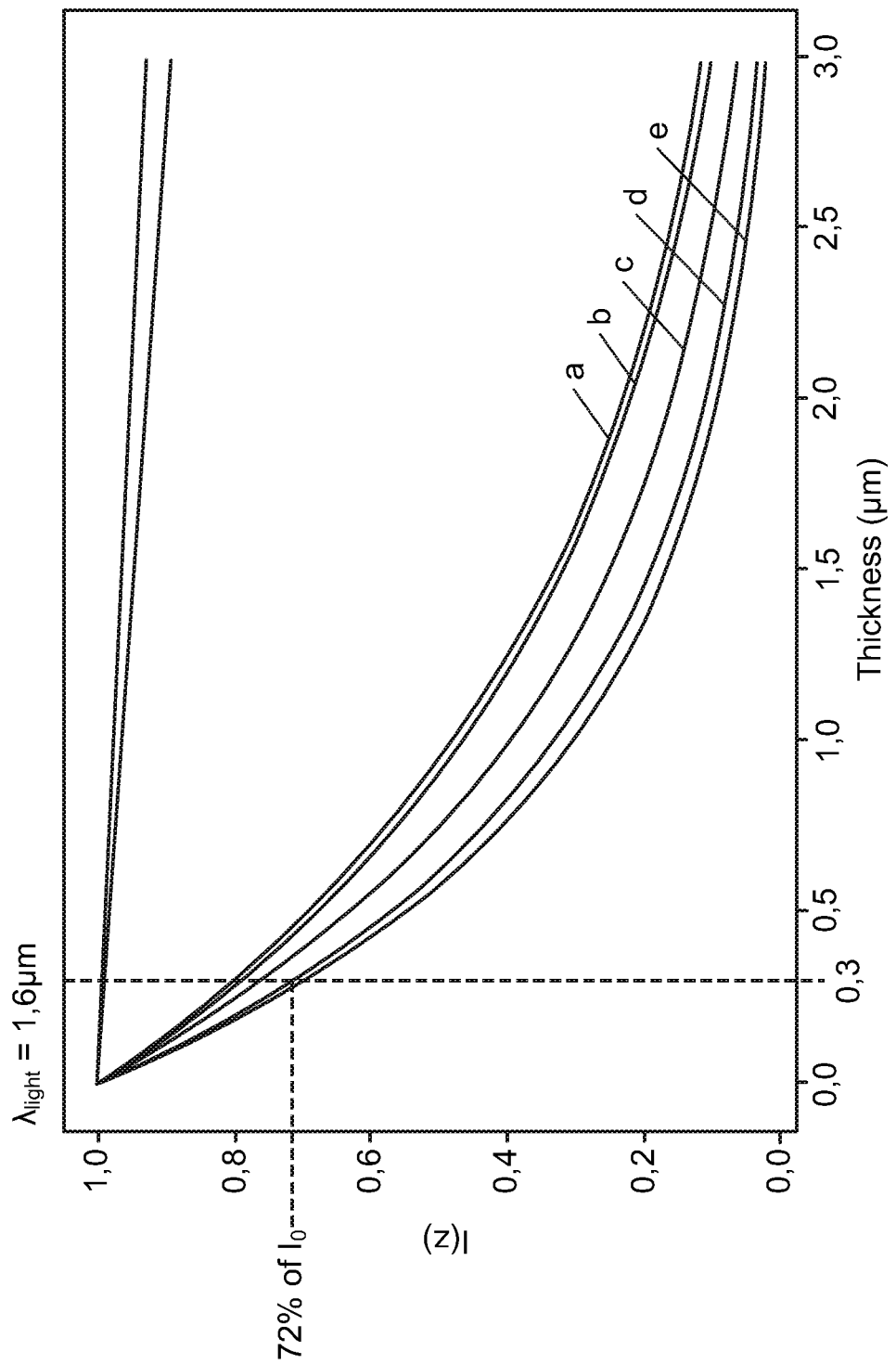
FIG. 8 shows simulation results of a SWIR detector of the invention.

Simulation results are illustrated in FIG. 8. The curves show the variation of the intensity through a $Ge_{1-x}Sn_x$ absorbing layer 80 in function of the depth in the layer 80. The incident light intensity is $I_0$. The curves a-e show curves corresponding respectively to layers having a Sn content between 3 and 10%. The other two curves at the top show Sn contents of 0 and 1% Sn content. It can be seen that between a content of Sn of 3 to 10% about 30% (i.e. 72% of $I_o$) is absorbed in the first 0.3 µm of the layer. FIG. 8 shows that more than 70% of SWIR light is absorbed at the wavelength of 1.6 µm within 3 µm of thickness of a $Ge_{1-x}Sn_x$ absorber material.

Efficiencies of more than 80% of absorption can be obtained by changing the characteristics of the absorbing layers 80.

A higher crystalline quality with no phase segregation or Sn precipitation may be achieved by the use of $Ge_{1-x-y}Si_xSn_y$ instead of $Ge_{1-x}Sn_x$.

Exemplary Applications

The FPA of the present invention may be used in various types of applications such as ground, airborne and space technology for intelligence, surveillance, military, security or encryption systems. It may also be used for spectroscopy, machine vision or non-invasive clinical investigations such as optical coherence tomography. More precisely, the FPA of the present invention can be integrated into and used in methods of the following fields of applications as described below.

LIDAR System-level benefits of large FPAs are related to providing a large instantaneous field of view and a fully electronic selection by reading out a region of interest (FOV). Large FPAs allow monitoring of large areas and enable key applications, such as high-resolution, wide-area airborne persistent surveillance. The detector larger format with smaller pixel size helps to solve the unmanned—aerial or terrestrial—vehicle (UV) automated "sense and avoid" problem. By using an array of detectors in a FPA, the mechanical scanning needed in single-detector systems can be avoided and because a photon-counting FPA has the ability to digitally time stamp individual photon arrivals it is an enabler for highly sensitive light detection and ranging ("LIDAR") imaging systems. In a LIDAR system the scene is illuminated by a short laser pulse, and imaged onto the FPA, where each single-photon avalanche diode measures photon arrival time, and therefore depth to the corresponding point in the scene whereas the image is built up by combining multiple frames.

Multi/Hyper-Spectral LIDAR Imaging

Most minerals contain distinct absorption features in the SWIR, making this region of the spectrum the best candidate for spectroscopic analysis in many applications. Hydroxyl bearing minerals, sulfates, and carbonate materials produced naturally on earth—or directly related to human activities such as the burning of fossil fuels and the deforestation—are easily identified through SWIR spectroscopy. Multi/hyper-spectral LIDAR imaging can thus provide a powerful tool for mapping, archaeology, earth science, glaciology, agricultural assessment and disaster response.

REFERENCES

The following additional Publications are incorporated herein by reference thereto and relied upon:

PUBLICATIONS

1. Alharthi B. et al., "Study of material and optical properties of $Si_xGe_{1-x-y}Sn_y$ alloys for Si-based optoelectronic device applications", Optical Materials Express, Vol. 7, No 10, 1 Oct. 2017

2. Aubin J. et al., "Impact of thickness on the structural properties of high tin content GeSn layers", Journal of Crystal Growth, 473, 20-27 (2017)
3. Lee J. et al., "Crystallization and Characterization of GeSn Deposited on Si with Ge Buffer Layer by Low-temperature Sputter Epitaxy, Journal of Semiconductor Technology and Science, Vol. 16, No 6, December 2016
4. Mattiazzo S. et al., "LePIX: first results from a novel monolithic sensor", Nucl. Instr. Meth. Phys. Res. A 718, 288-291, 2013
5. Mosleh A. et al., "Buffer-Free GeSn and SiGeSn Growth on Si Substrate Using In Situ SnD4 Gas Mixing", Journal of Electronic Materials, Vol. 45, No 4, 11 Feb. 2016
6. Wirths S. et al., "Si—Ge—Sn alloys: From growth to application", Prog. Cryst. Growth Charact. Mater. 62, 1, March 2016
7. Yeh W. et al., "Sputter Epitaxial Growth of Flat Germanium Film with Low Threading-Dislocation Density on Silicon (001)", ECS journal of Solid State Science and Technology, 3 (10) Q195-Q199, 1 Aug. 2014
8. Zheng J. et al., "GeSn p-i-n photodetectors with GeSn layer grown by magnetron sputtering epitaxy", Appl. Phys. Letters 108, 033503, 20 Jan. 2016

The invention claimed is:

1. A short-wave infrared (SWIR) detector array defining an incident light surface and a lower surface opposite to said incident light surface, the SWIR detector array comprising:
    at least one SWIR absorbing layer configured to convert, in electrical charges, electromagnetic waves having a wavelength comprised between 1.0 µm and 3.0 µm;
    a p-n junction;
    an annealed crystalline buffer layer; and
    a doped readout wafer disposed in relation to the SWIR absorbing layer opposite to said incident light surface and separated from said SWIR absorbing layer by the annealed crystalline buffer layer, the doped readout wafer being either p-doped or n-doped, the doped readout wafer having a deposition surface, the doped readout wafer comprising
        at least one charge collecting area that is one of p-doped and n-doped, and
        a complementary metal-oxide semiconductor (CMOS) electrical circuit,
    said annealed crystalline buffer layer being disposed on the deposition surface and being at least partially made of germanium (Ge), the annealed crystalline buffer layer comprising an oxide-free surface to a side away from said doped readout wafer, the annealed crystalline buffer layer having a crystalline structure that overcomes differences of lattice and dilatation coefficients between said doped readout wafer and said at least one SWIR absorbing layer,
    said at least one SWIR absorbing layer being disposed on said oxide-free surface, said at least one SWIR absorbing layer being at least partially made of germanium (Ge) and tin (Sn).

2. The SWIR detector array according to claim 1, wherein said p-n junction is disposed at an interface of the annealed buffer layer and the doped readout wafer.

3. The SWIR detector array according to claim 1, wherein said CMOS electrical circuit is processed in said doped readout wafer to be accessible to a side opposite a side of said annealed crystalline buffer layer.

4. The SWIR detector array according to claim 1, wherein said SWIR absorbing layer has a thickness t1, defined in a direction perpendicular to said deposition surface, of more than 350 nm.

5. The SWIR detector array according to claim 1, further comprising a p-i-n structure and an avalanche region.

6. The SWIR detector array according to claim 1, wherein said annealed crystalline buffer layer is a layer deposited by sputter epitaxy.

7. The SWIR detector array according to claim 1, wherein said annealed crystalline buffer layer is made of $Ge_{1-x}Sn_x$ and has a Sn content x between $0.00 \leq x \leq 0.03$.

8. The SWIR detector array according to claim 6, wherein said at least one SWIR absorbing layer has a Sn content x which is higher than 0.03 and lower than 0.12.

9. The SWIR detector array according to claim 1, wherein the at least one SWIR absorbing layer is made of $Si_xGe_{1-x-z}Sn_z$.

10. The SWIR detector array according to claim 9, wherein x is higher than 0.06 and lower than 0.20.

11. The SWIR detector array according to claim 9, wherein z is higher than 0.02 and lower than 0.10.

12. The SWIR detector array according to claim 1, wherein said SWIR absorbing layer comprises a layer made of $Si_xGe_{1-x-z}Sn_z$.

13. The SWIR detector array according to claim 1, wherein said p-n junction is disposed inside said doped readout wafer.

* * * * *